United States Patent [19]

Bobb

[11] Patent Number: 4,644,273
[45] Date of Patent: Feb. 17, 1987

[54] FIVE-AXIS OPTICAL FIBER GRADIOMETER

[75] Inventor: Lloyd C. Bobb, Willow Grove, Pa.

[73] Assignee: The United States of America as represented by the Secretary of the Navy, Washington, D.C.

[21] Appl. No.: 750,970

[22] Filed: Jul. 2, 1985

[51] Int. Cl.⁴ ............................................. G01R 33/02
[52] U.S. Cl. ..................................... 324/244; 324/96; 250/227; 250/231 R
[58] Field of Search .................. 324/244, 96; 250/227, 250/231 R; 350/376

[56] References Cited

U.S. PATENT DOCUMENTS

| | | | |
|---|---|---|---|
| 2,549,845 | 4/1951 | Mouzon et al. | 324/244 |
| 3,530,375 | 9/1970 | Passier | 324/244 |
| 3,663,953 | 5/1972 | Salvi | 324/244 |
| 4,147,979 | 4/1979 | Baues et al. | 324/244 |
| 4,368,430 | 1/1983 | Dale et al. | 324/244 |
| 4,371,838 | 2/1983 | Griscom | 324/244 |
| 4,450,406 | 5/1984 | Bobb | 324/244 |
| 4,495,467 | 1/1985 | Kuno et al. | 324/244 |
| 4,523,147 | 6/1985 | D'Angelo et al. | 324/244 |
| 4,587,487 | 5/1986 | Zanzucchi | 324/244 |
| 4,591,786 | 5/1986 | Koo et al. | 324/244 |

Primary Examiner—David C. Nelms
Assistant Examiner—Charles Wieland
Attorney, Agent, or Firm—Robert F. Beers; Henry Hansen; James R. Burdett

[57] ABSTRACT

A magnetic field gradiometer includes a geometric arrangement of fiber optic sensors through which light from a single frequency laser is transmitted. Having a pair of single-mode optical fibers, each of which are coupled to a magnetostrictive element, each sensor is formed in the manner of a Mach-Zehnder interferometer which is oriented to detect the spatial variation in a particular orthogonal component of the magnetic field by phase comparison of the light transmitted through its respective pair of fibers.

4 Claims, 6 Drawing Figures

FIVE-AXIS OPTICAL FIBER GRADIOMETER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates generally to magnetic field sensors, and more particularly to apparatus having a plurality of orthogonally disposed optical fiber interferometers for determining the gradient of a magnetic field.

Magnetometers of the flux-gate or gas types have long been used to measure the Earth's magnetic field. For the detection of a magnetic local anomaly, however, the measurement of the spatial magnetic field gradient is of interest as well as the absolute magnitude of the field itself. Devices used in such measurements are referred to as "gradient field" magnetometers or simply gradiometers.

The most recent advances in the art of gradiometry utilize superconducting quantum interference devices (SQUID's) which are capable of detecting magnetic fields as small as $10^{-11}$ or $10^{-12}$ Gauss in the laboratory (see Giallorenzi et al, "Optical Fiber Sensor Technology," *IEEE Journal of Quantum Electronics*, Vol. QE-18, No. 4, April 1982, pp. 626–665). Nevertheless, SQUID's are often substantially less sensitive in the field and require cryogenic instrumentation for their operation, thus, severely limiting the conditions under which they can be effectively utilized.

SUMMARY OF THE INVENTION

Accordingly, it is a general purpose and object of the present invention to provide an improved sensor for measuring the gradient of a magnetic field. More specifically, it is an object of the present invention to provide a gradiometer, the sensitivity of which approaches that of SQUID's, which is capable of operating at room temperature and which is adaptable to an avionics environment.

Briefly, these and other objects of the present invention are accomplished by a fiber optic apparatus including a plurality of orthogonally disposed interferometric sensors, each of which measures its respective component of the magnetic field gradient by comparing the phase of coherent light transmitted from a laser source thorough a pair of single-mode optical fiber arms bonded to or jacketed by a magnetostrictive material.

For a better understanding of these and other aspects of the present invention, reference may be made to the following detailed description taken in conjunction with the accompanying drawing in which like reference characters designate like items throughout the figures thereof.

DESCRIPTION OF THE PREFERRED EMBODIMENT

Figure 1:
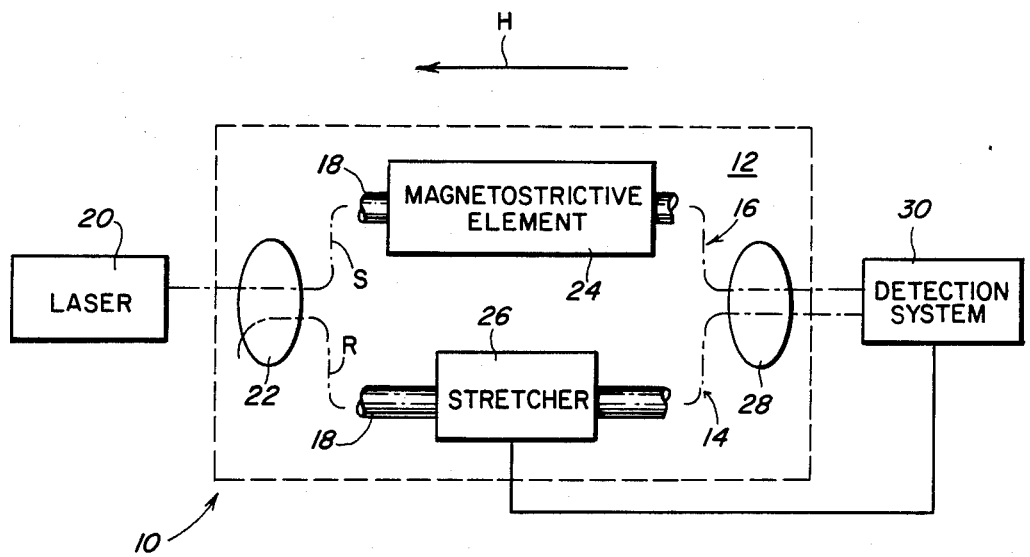
FIG. 1 illustrates a typical prior art optical fiber magnetic field sensor.

Referring first to FIG. 1, there is shown a typical prior art sensor 10, including a conventional Mach-Zehnder interferometer 12 having a reference arm 14 and a sensing arm 16, each of which is formed of a single-mode optical fiber 18 adapted to measure a small magnetic field H. Light from a laser source 20 is split equally into a pair of signals R and S by a splitter 22, signal R being transmitted through the reference arm 14 and signal S being transmitted through the sensing arm 16 where it interacts with the field H.

Figure 2B:
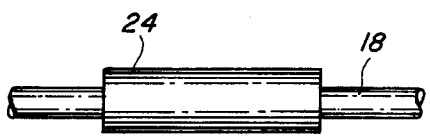
FIGS. 2a–2c show three basic configurations of the magnetostrictive element used in the sensor of FIG. 1.
Figure 2A:
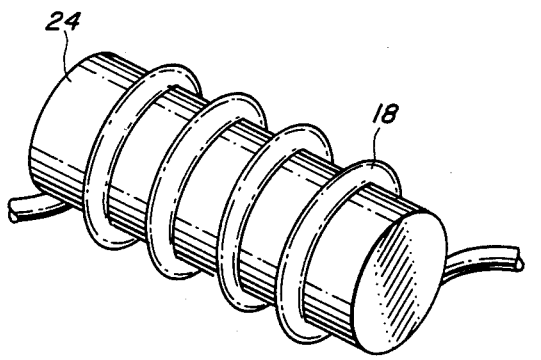
Figure 2C:
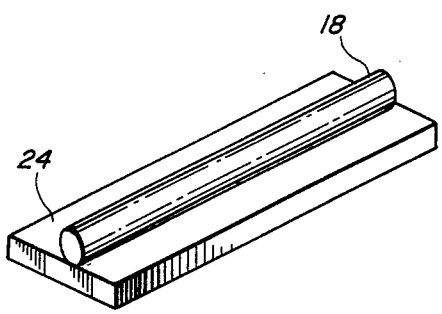

As is well known, the fundamental principle behind the operation of the sensing arm 16 is associated with the measurement of the longitudinal strain induced in its fiber 18 by a magnetostrictive element 24 attached thereto in any one of the three basic configurations shown in FIGS. 2a through 2c. For example, the element 24 may take the form of a bulk magnetostrictive cylinder about which the fiber 18 is bonded to its circumference as illustrated in FIG. 2a; or, a magnetostrictive coating applied uniformly to the surface of the fiber 18 as shown in FIG. 2b; or, a magnetostrictive strip to which the fiber 18 is bonded in the manner of FIG. 2c. Furthermore, the element 24 may be formed of any suitable magnetostrictive material such as iron, cobalt, and nickel and various alloys and compounds thereof as well as commercially available metallic glasses. Such an element 24, when placed along the axis of the field H, will undergo a change in dimensions causing a concomitant change in the optical path length of its respective fiber 18 such that signal S is phase modulated in proportion to the strength of the field H.

In order to determine that strength, referring again to FIG. 1, the reference arm 14 has attached to it a stretcher 26 or similar such means to artificially induce a phase shift in the signal R which when recombined with signal S by a combiner 28 and analyzed by detection system 30 will maintain the familiar quadrature condition therebetween. The detection system 30 is conventional in nature and is more fully described with its alternative configurations in Giallorenzi et al, supra, pp. 657–661.

If the reference arm 14 and the sensing arm 16 were similarly configured, that is, if both fibers 18 were formed to be bonded to or jacketed by the magnetostrictive element 24 in one of the aforementioned manners, no signal would be generated by the detection system 30 since there would be no phase difference between the light signals transmitted through the two arms 14 and 16. However, it can be seen that such an optical fiber interferometric sensor having both arms sensitive to the magnetic field would inherently be a gradient sensor.

Figure 3:
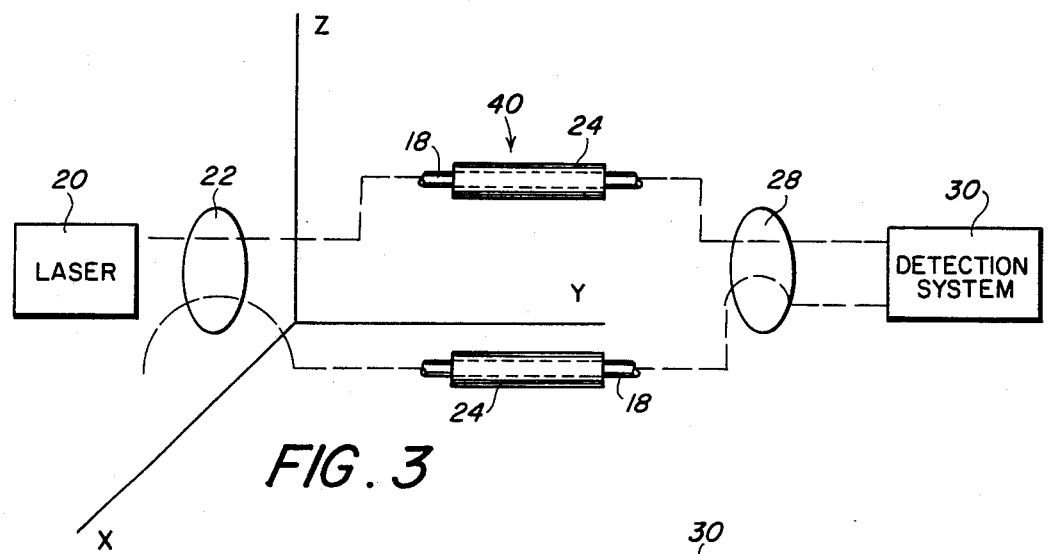
FIG. 3 illustrates one embodiment of a sensor used in the gradiometer of the present invention.
Figure 4:
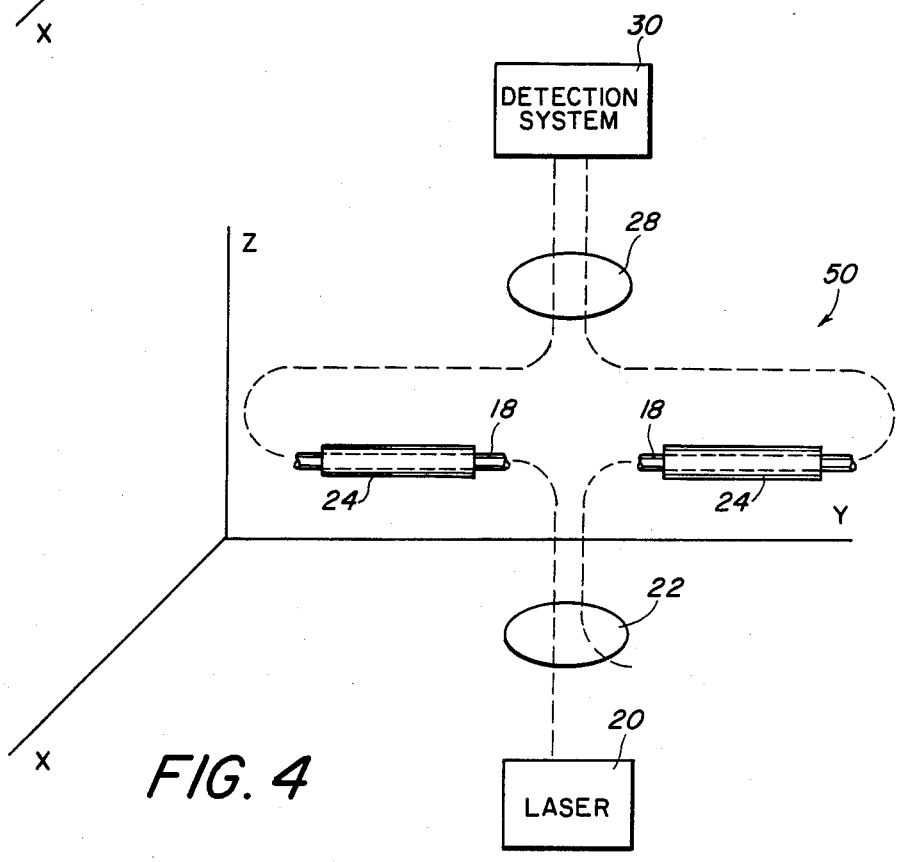
FIG. 4 illustrates a second embodiment of a sensor used in the gradiometer of the present invention.

Referring now to FIG. 3, there is shown an optical fiber sensor 40 which is particularly arranged to measure one component of the magnetic field H. Both fibers 18 are adapted to be formed with a magnetostrictive element 24 and oriented such that they sense the y-component of the field H ($H_y$) at their respective location which is different in z. Such a configuration is, thus, determinative of the z-variation in $H_y$ or $H_{yz}$. Moreover, similar such sensors 40 which are placed in the x-y and x-z planes will likewise detect the $H_{xy}$ and $H_{xz}$ components respectively. If, however, a sensor 50 having both fibers 18 adapted to be formed with a magnetostrictive element 24 is oriented as shown in FIG. 4, the variation in $H_y$ along the y-axis may be determined. Similarly, a sensor 50 with its fibers 18 placed along the x-axis will detect $H_{xx}$.

Having described in detail the structural features of the invention, the operation and use thereof will now be summarized with reference to FIGS. 3 and 4. A first plurality of sensors 40 numbering at least three are orthogonally disposed in a preselected number of planes, preferably the x-y and x-z, and y-z planes at a minimum. A second plurality of sensors 50 numbering at least two are disposed preferably along the x and y axes. Single-frequency light from a laser source 20 is coupled into the sensors 40 and 50 such that the spatial variations in each respective orthogonal component is detected when the magnetostrictive elements 24 induce phase shifts in the light, proportional to the strength of the magnetic field H as determined by the detection system 30, and as described by the determinant $$\begin{bmatrix} H_{xx} & H_{xy} & H_{xz} \\ H_{yx} & H_{yy} & H_{yz} \\ H_{zx} & H_{zy} & H_{zz} \end{bmatrix}$$

where
$H_{xx} + H_{yy} + H_{zz} = 0$
and
$H_{yx} = H_{xy}$
$H_{zx} = H_{xz}$
$H_{yz} = H_{zy}$ Therefore, only the components $H_{xy}$, $H_{xz}$, $H_{yz}$, $H_{xx}$ and $H_{yy}$ need be determined.

Some of the many advantages of the invention should now be readily apparent. For example, a novel sensor has been provided which is capable of accurately measuring the gradient of a small magnetic field while operating at temperatures above those which require cryogenic equipment. Additionally, the sensor is small, light in weight, and adaptable to an avionics environment.

Obviously many modifications and variations of the present invention are possible in light of the above teachings. For example, while the term light is used throughout the specification, it should be obvious that the term includes both the visible and invisible light and includes all wavelengths which can be transmitted by the optical fibers. Furthermore, one laser source may be used to drive the entire system. It is therefore to be understood that within the scope of the appended claims, the invention may be practiced otherwise than as specifically described.

What is claimed is:

1. A five-axis magnetic field gradiometer, comprising:
   a single-frequency laser;
   a first plurality of three interferometers, each of said first plurality including two single-mode optical fibers operatively connected to receive light from said laser and a first pair of magnetostrictive elements, each element connected to respective ones of said fibers for changing the length of said fibers in accordance with their respective magnetic field components, each of said first pairs positioned in a different plane mutually perpendicular to the other planes and the elements of each of said first pairs spaced apart a predetermined distance and positioned parallel to each other and to one of the planes and equidistant from the other plane;
   a second plurality of two interferometers, each of said second plurality including two single-mode optical fibers that are operatively connected to receive light from said laser and a second pair of magnetostrictive elements, each element connected to respective ones of said fibers for changing the length of said fibers in accordance with their respective magnetic field components, the elements of each of said second pairs positioned collinearly and spaced apart a predetermined distance and each of said second pairs positioned parallel to respective pairs of planes;
   first converter means operatively connected to said first and second pluralities for converting the light output from said pluralities to electrical signals indicative thereof; and
   second converter means connected to receive the electrical signals and convert the signals to magnetic field gradient component values.

2. Apparatus according to claim 1, wherein each of said magnetostrictive elements comprises:
   a magnetostrictive cylinder about the circumference of which is bonded a predetermined length of its respective fiber.

3. Apparatus according to claim 1, wherein each of said magnetostrictive elements comprises:
   a magnetostrictive coating applied uniformly to the surface of its respective fiber.

4. Apparatus according to claim 1, wherein each of said magnetostrictive elements comprises:
   a magnetostrictive strip bonded along its longitudinal axis to its respective fiber.

* * * * *